US008652309B2

United States Patent
Ohishi et al.

(10) Patent No.: US 8,652,309 B2
(45) Date of Patent: Feb. 18, 2014

(54) SPUTTERING APPARATUS AND ELECTRONIC DEVICE MANUFACTURING METHOD

(75) Inventors: Tetsuya Ohishi, Hino (JP); Yu Fujimoto, Hino (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 367 days.

(21) Appl. No.: 12/842,264

(22) Filed: Jul. 23, 2010

(65) Prior Publication Data

US 2011/0147199 A1    Jun. 23, 2011

(30) Foreign Application Priority Data

Dec. 22, 2009  (JP) ................................. 2009-291336
Jun. 2, 2010   (JP) ................................. 2010-127300

(51) Int. Cl.
*C23C 14/34*    (2006.01)
(52) U.S. Cl.
USPC .................................................... 204/298.11
(58) Field of Classification Search
USPC ............................ 204/192.1, 192.12, 298.11
See application file for complete search history.

(56) References Cited

U.S. PATENT DOCUMENTS

| 3,573,190 A * | 3/1971 | Bloom ...................... 204/298.03 |
| 7,033,461 B2 * | 4/2006 | Tani et al. ................. 204/192.13 |
| 2005/0199490 A1 * | 9/2005 | Nomura et al. .......... 204/298.11 |

FOREIGN PATENT DOCUMENTS

| JP | 62093369 A | * | 4/1987 |
| JP | 63190331 A | * | 8/1988 |
| JP | 03200320 A | * | 9/1991 |
| JP | 04193948 A | * | 7/1992 |
| JP | 2002-302763 | | 10/2002 |
| JP | 2006-070323 | | 3/2006 |

OTHER PUBLICATIONS

Machine Translation to Kobayashi (JP 2002-302763) published Oct. 2002.*

* cited by examiner

*Primary Examiner* — Keith Hendricks
*Assistant Examiner* — John Brayton
(74) *Attorney, Agent, or Firm* — Fitzpatrick, Cella, Harper & Scinto

(57) ABSTRACT

A sputtering apparatus comprises a substrate holder, and a screening member configured to screen a substrate mount surface of a surface of the substrate holder. The screening member comprises a first screening member configured to rotate about an axis in a first direction perpendicular to the substrate mount surface and screen at least a first area, and a second screening member configured to rotate about the axis and screen at least a second area. The first and second screening members are configured to be rotated to move between a screening position at which the first screening member screens at least the first area and the second screening member screens at least the second area and a retreat position at which the first and second screening members retract from an area above the substrate mount surface and overlap each other.

4 Claims, 6 Drawing Sheets

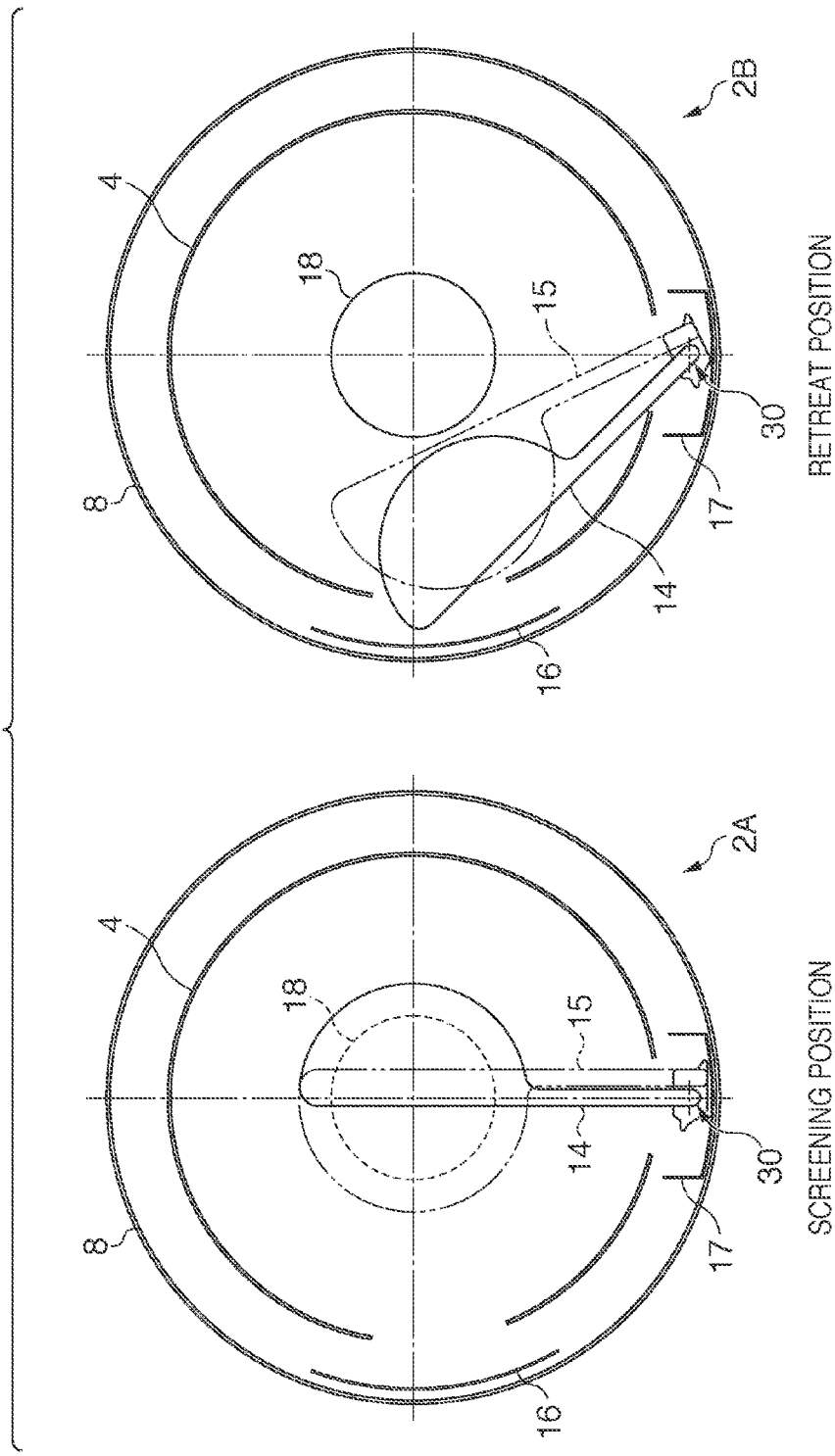

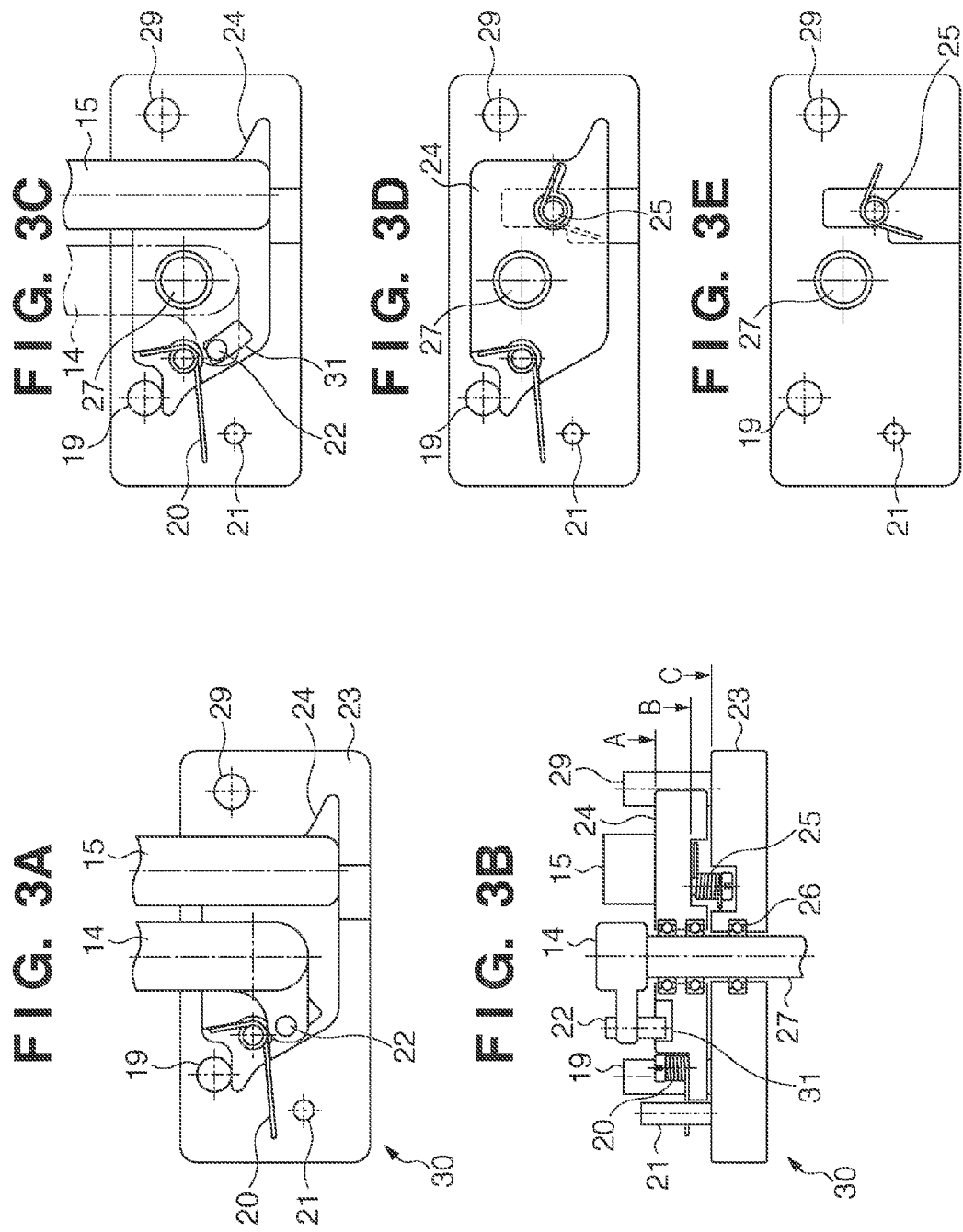

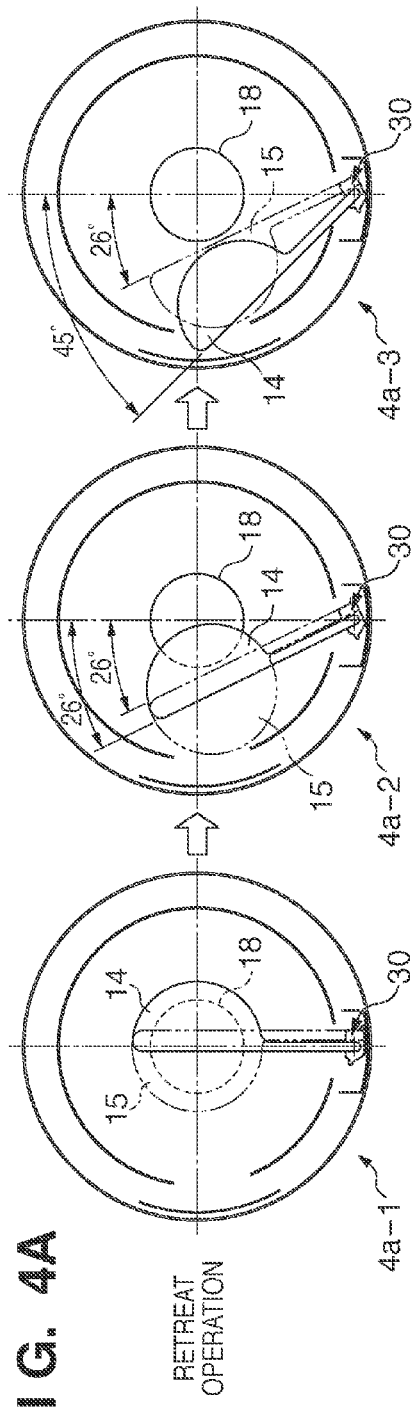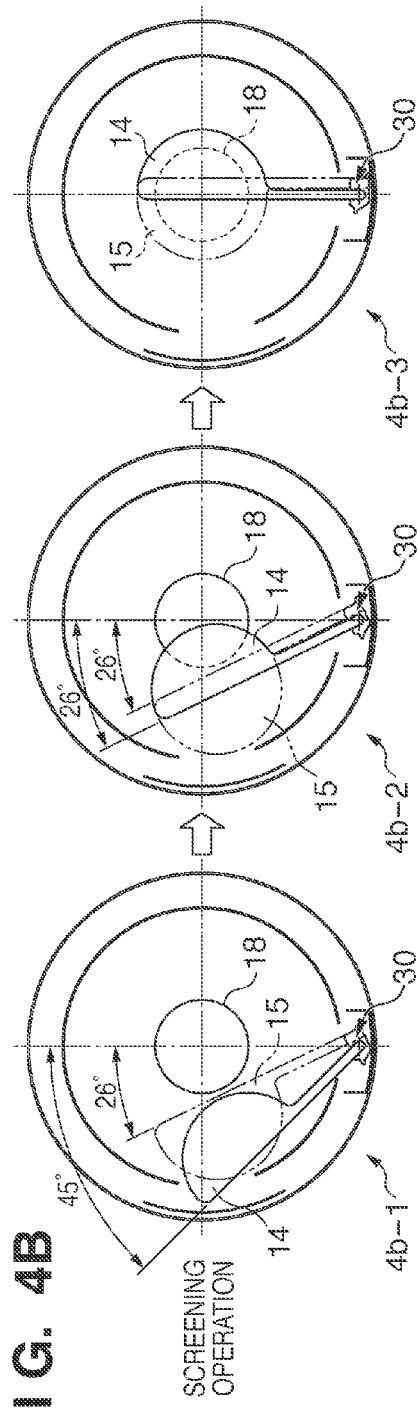

FIG. 5A
RETREAT OPERATION
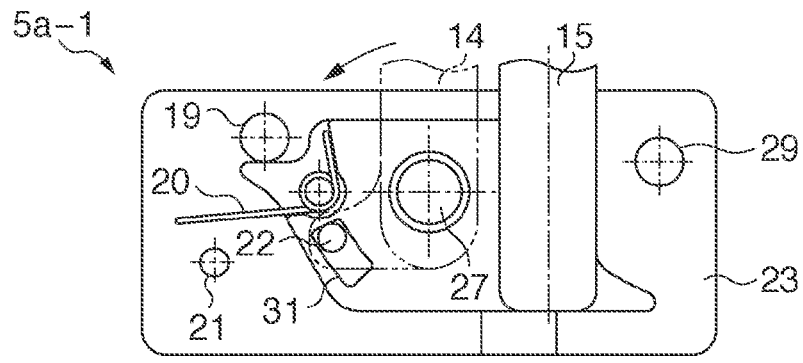
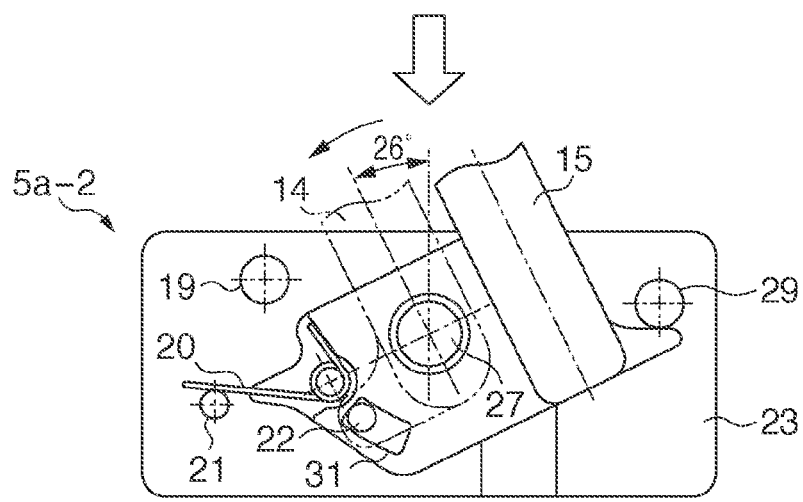
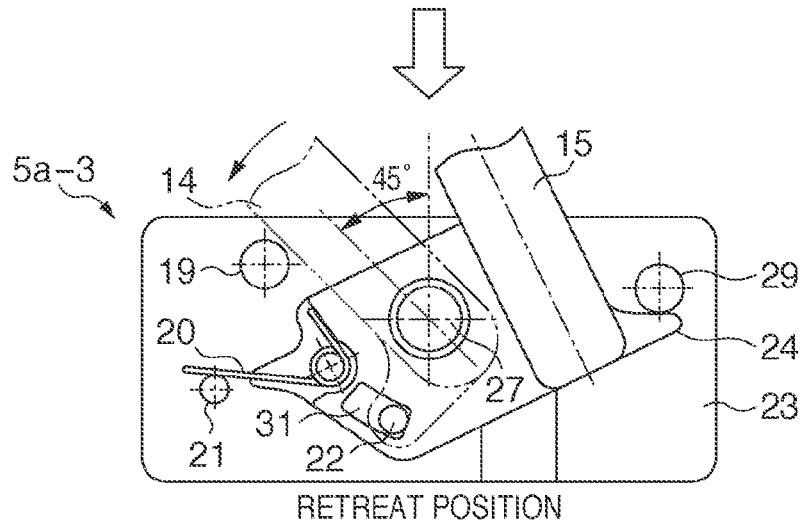

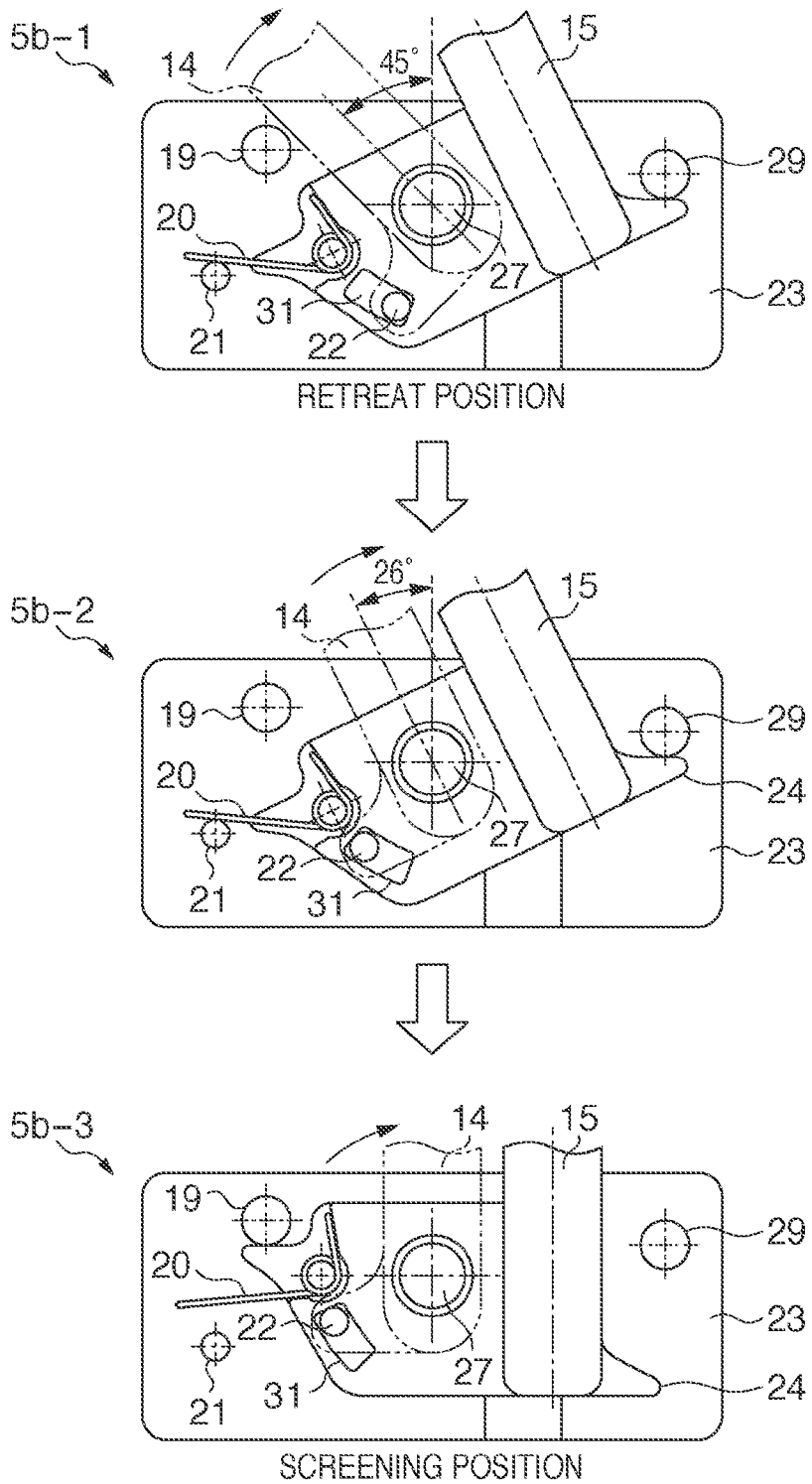

SPUTTERING APPARATUS AND ELECTRONIC DEVICE MANUFACTURING METHOD

BACKGROUND OF THE INVENTION

1. Field of the Invention

The present invention relates to a sputtering apparatus used in a semiconductor manufacturing process and a method of manufacturing an electronic device.

2. Description of the Related Art

Conventionally, plasma characteristics are stabilized by a method of performing deposition on a substrate by sputtering a target. Such a sputtering method uses a screening mechanism to cover the surface of a substrate holder. For example, Japanese Patent Laid-Open No. 2006-70323 discloses a vacuum deposition apparatus including a first screening plate which screens between a substrate and a target and a second screening plate which is placed near a side located closer to the substrate than the first screening plate and is provided with an opening portion to deposit a film on only a part of the substrate.

SUMMARY OF THE INVENTION

At the time of deposition on a substrate, however, a conventional screening mechanism demands a space to retract in a chamber, resulting in an increase in the size of the apparatus. With a recent trend toward larger substrates, more compact apparatuses are required. It is, therefore, an object of the present invention to provide a compact sputtering apparatus having a small space to allow a screening mechanism to retract.

According to a one aspect of the present invention there is provided a sputtering apparatus comprising a substrate holder configured to hold a substrate, a target holder configured to hold a target, and a screening member configured to screen a substrate mount surface of a surface of the substrate holder on which a substrate is mounted, wherein the substrate mount surface includes a first area and a second area, the screening member comprises a first screening member configured to rotate about an axis in a first direction perpendicular to the substrate mount surface and screen at least the first area, a second screening member configured to rotate about the axis and screen at least the second area, and a rotating mechanism configured to rotate the first screening member and the second screening member, and the first screening member and the second screening member are configured to be rotated by the rotating mechanism to move between a screening position at which the first screening member screens at least the first area and the second screening member screens at least the second area and a retreat position at which the first screening member and the second screening member retract from an area above the substrate mount surface and overlap each other. The first screening member can be moved from the screening position to the retreat position by being rotated by the rotating mechanism about the axis through a first angle in a first rotating direction, and the second screening member is moved from the screening position to the retreat position by being rotated by the rotating mechanism about the axis through a second angle smaller than the first angle in the first rotating direction.

According to an embodiment of the present invention, the rotating mechanism can include a driving mechanism configured to rotate and drive the first screening member between the screening position and the retreat position, a regulating member configured to regulate rotation of the second screening member about the axis within a range of the second angle between the screening position and the retreat position, a member configured to apply force to the second screening member to rotate the second screening member about the axis in the first rotating direction, a first engaging member formed on the first screening member, and a second engaging member formed on the second screening member, and one of the first engaging member and the second engaging member includes a pin, and the other of the first engaging member and the second engaging member includes a hole, the pin being configured to rotate about the axis in the hole in a stopped state through an angle corresponding to a difference between the first angle and the second angle, or the hole being configured to rotate about the axis relative to the pin located in the hole and set in a stopped state through the angle corresponding to the difference. The regulating member can include a first stopper and a second stopper configured to regulate rotation of the second screening member at each of the screening position and the retreat position, and the member configured to apply force to the second screening member includes a spring. According to an embodiment of the present invention, the sputtering apparatus can further comprise a shield placed inside a chamber, wherein the rotating mechanism is provided outside the shield.

According to the second aspect of the present invention there is provided a method of manufacturing an electronic device by using a sputtering apparatus comprising a substrate holder configured to hold a substrate, a target holder configured to hold a target, and a screening member configured to screen a substrate mount surface of a surface of the substrate holder on which a substrate is mounted, wherein the substrate mount surface includes a first area and a second area, the screening member comprises a first screening member configured to rotate about an axis in a first direction perpendicular to the substrate mount surface and screen at least the first area, a second screening member configured to rotate about the axis and screen at least the second area, and a rotating mechanism configured to rotate the first screening member and the second screening member, the first screening member and the second screening member are configured to be rotated by the rotating mechanism to move between a screening position at which the first screening member screens at least the first area and the second screening member screens at least the second area and a retreat position at which the first screening member and the second screening member retract from an area above the substrate mount surface and overlap each other, the method comprising a first step of locating the first screening member and the second screening member at the screening position by using the rotating mechanism, a second step of performing deposition by sputtering a target held by the target holder, after the first step, while maintaining the first screening member and the screening member at the screening position, and a third step of performing deposition on the substrate mounted on the substrate holder by sputtering the target, after the second step, while placing the first screening member and the screening member at the retreat position by using the rotating mechanism.

The present invention can provide a compact sputtering apparatus having a small space to allow a screening mechanism to retract.

Further features of the present invention will become apparent from the following description of exemplary embodiments with reference to the attached drawings.

BRIEF DESCRIPTION OF THE DRAWINGS

FIG. 2 shows a screening member at screening position and a retreat position;

FIGS. 3A to 3E explain the detailed arrangement of the rotating mechanism of the screening member;

FIGS. 4A and 4B show how the screening member moves from the screening position to the retreat position and moves from the retreat position to the screening position; and FIGS. 5A and 5B explain the operation of the rotating mechanism when the screening member moves from the screening position to the retreat position and moves from the retreat position to the screening position.

DESCRIPTION OF THE EMBODIMENTS

Figure 1:
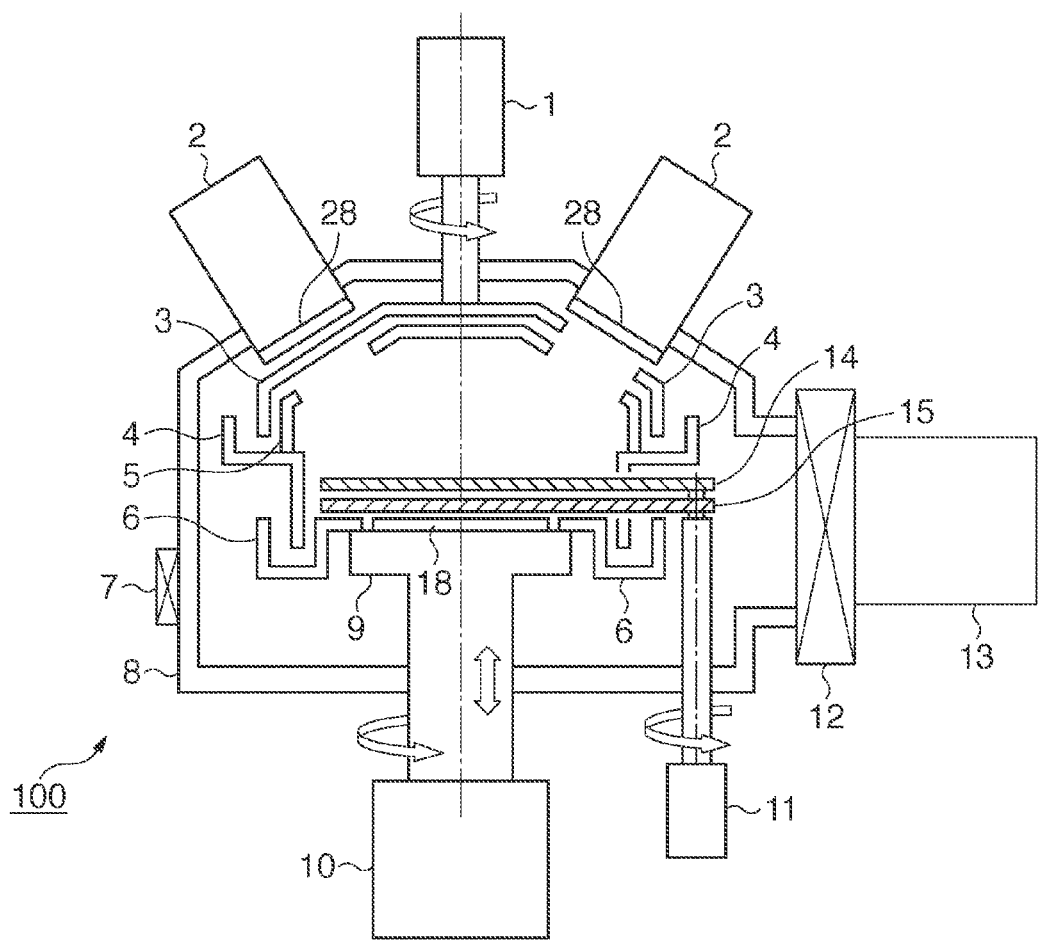
FIG. 1 is a schematic sectional view for explaining an example of the overall arrangement of a sputtering apparatus.

A preferred embodiment of the present invention will be exemplarily described in detail below with reference to the accompanying drawings.

An example of the overall arrangement of a sputtering apparatus will now be described with reference to FIG. 1. FIG. 1 is a schematic view of a sputtering apparatus 100 according to an embodiment of the present invention. The sputtering apparatus 100 includes a chamber 8, an exhaust unit (vacuum pump) 13 to exhaust the chamber through an exhaust port, an inert gas introduction system (not shown) to introduce an inert gas into the chamber 8, and a reactive gas introduction system (not shown) to introduce a reactive gas. The exhaust unit 13 exhausts, through an exhaust port, an inert gas and a reactive gas after they are introduced into the chamber 8 to generate sputtered particles (to be described later) or be used to form films.

A main valve 12 is provided between the exhaust port and the exhaust unit 13. The chamber 8 accommodates a target holder 2 to hold a target 28 whose sputtering surface is exposed and a substrate holder 9 to hold a substrate 18 at a predetermined position where the sputtered particles emitted from the target 28 reach. Grounded cylindrical shields 4 and 5 (deposition preventing shield members) are provided on the inner surface of the chamber 8 between the target holder 2 which holds the target 28 and the substrate holder 9. The shields 4 and 5 (deposition preventing shield members) prevent sputtered particles from being directly attracted to the inner surface of the chamber 8. The chamber 8 has a gate valve 7. The target 28 is placed at an upper oblique position (offset position) relative to the substrate 18. That is, the center point of the sputtering surface of the target 28 is located at a position shifted from a normal to the center line of the surface of the substrate 18 by a predetermined distance. A power supply to apply sputtering discharge power is connected to the target holder 2. As a sputtering power supply, a DC power supply or RF power supply may be used. Auxiliary shields 16 and 17 are provided on the inner wall of the chamber 8 which is not covered by the shield 4 to prevent sputtered particles from being attracted to the inner wall of the chamber 8.

A target holder screening member 3 is placed near below the target holder 2 so as to cover the target 28. The target holder screening member 3 includes screening plates having a double rotation structure which allows each screening plate to be independently opened/closed. The target holder screening member 3 is a screening member which can switch between a screened state in which the space between the substrate holder 9 and the target holder 2 is screened and an open state in which the space between the substrate holder 9 and the target holder 2 is opened. The target holder screening member 3 also includes a driving mechanism 1 which rotates/drives the target holder screening member 3 so as to allow the double rotation screening plates to independently perform screening operation or opening operation.

A screening member cover shield 6 having a ring shape is provided on the surface of the substrate holder 9 and around the outer edge side (outer peripheral portion) of the mount surface of the substrate 18. The cover shield 6 on the periphery of the substrate prevents sputtered particles from being attracted to a place other than the deposition surface of the substrate 18 placed on the substrate holder 9. The substrate holder 9 includes a driving unit 10 for the substrate holder 9 which moves the substrate holder 9 vertically and rotates it at a predetermined velocity. The driving unit 10 for the substrate holder 9 can move the substrate holder 9 vertically to move the substrate holder 9 upward toward substrate screening members 14 and 15 in a screening state or lower the substrate holder 9 relative to the substrate screening members 14 and 15.

The substrate screening members 14 and 15 which can screen the substrate mount surface of the surface of the substrate holder 9 on which the substrate 18 is mounted are arranged between the substrate holder 9 and the target holder 2. The substrate mount surface includes first and second areas. The substrate screening members include the first screening member 14 which can rotate about an axis in the first direction (Z direction) perpendicular to the substrate mount surface and can screen at least the first area of the substrate mount surface and the second screening member 15 which can rotate about the same axis as that of the first screening member and can screen at least the second area of the substrate mount surface. In this embodiment, the first screening member 14 is placed above the second screening member 15. However, either of the members can be placed above the other of the members. The first screening member 14 and the second screening member 15 are configured to rotate about the same axis. As will be described in detail later, a driving mechanism 11 rotates/drives the first screening member to move the first screening member 14 and the second screening member 15 between the screening position and the retreat position.

The first and second screening members 14 and 15 are made of stainless steel or an aluminum alloy. When heat resistance is required, the screening members may be made of titanium or a titanium alloy. Fine projections and recesses are formed on at least the surfaces of the first and second screening members 14 and 15 which face the target 28 by a blast process such as a sand blast process. This makes it difficult for films adhering to the first and second screening members 14 and 15 to peal off, and hence can reduce particles generated by peeling. It is possible to form thin metal films on the surfaces of the first and second screening members 14 and 15 by a metal spraying process instead of a blast process. A metal spraying process costs more than a blast process performed alone, but has the merit of allowing adhering films to be peeled together with metal-sprayed films when performing maintenance by peeling the adhering films by detaching the first and second screening members 14 and 15. In addition, the metal-sprayed films reduce the stress of sputtered films to prevent the peeling of films. The first and second screening members 14 and 15 are configured not to touch each other except at a rotating mechanism 30 (to be described later). This can prevent the generation of particles near the substrate.

A main control unit (not shown) is electrically connected to a target power supply (not shown) to apply sputtering discharge power to the target holder 2, an inert gas introduction system (not shown), a reactive gas introduction system (not shown), the driving unit 10 of the substrate holder, the driving mechanism 11 of the first screening member, the driving mechanism 1 of the target holder screening member, a pressure gauge (not shown), and the gate valve 7. The main control unit is configured to manage and control the operation of the sputtering apparatus (to be described later).

The storage device incorporated in the main control unit stores control programs for the execution of a deposition method and the like for a substrate accompanying conditioning and sputtering according to the present invention. For example, the control programs are implemented as a mask ROM. Alternatively, it is possible to install the control programs in a storage device constituted by a hard disk drive (HDD) and the like via an external recording medium or network.

The substrate screening members constituted by the first and second screening members 14 and 15 will now be described with reference to FIG. 2. In FIG. 2, 2A is a plan view for explaining the positions of the substrate screening members 14 and 15 at the screening position. In FIG. 2, 2B is a plan view for explaining the positions of the substrate screening members 14 and 15 at the retreat position. As shown in 2A in FIG. 2, the first screening member 14 having a semicircular shape and the second screening member 15 having a semicircular shape are arranged on the substrate 18 such that only portions of the respective diameter portions overlap each other. This makes the first and second screening members 14 and 15 screen the overall substrate 18 in cooperation with each other.

As shown in 2B in FIG. 2, in contrast, when the first and second screening members 14 and 15 move to the retreat position, the first and second screening members 14 and 15 overlap each other. Since the first and second screening members overlap each other, the space at the retreat position of the substrate screening members constituted by the first and second screening members 14 and 15 is made compact. This prevents the sputtering apparatus 100 from increasing in size. As is obvious from 2A and 2B in FIG. 2, the amount of rotation of the first screening member 14 which is required to switch between the screening position and the retreat position is larger than that of the second screening member 15. That is, setting different amounts of rotation required for switching between the screening position and the retreat position for the first and second screening members 14 and 15 makes it possible to secure a large screening area by inhibiting them from overlapping, in effect, at the screening position and to reduce the space at the retreat position by making them overlap at the retreat position. As shown in 2A in FIG. 2, the arcuated shield 4 and the concentric arcuated auxiliary shield 16 spaced apart from the shield 4 are arranged to cover the inner wall of the chamber 8. The rotating mechanism 30 is placed between the shield 4 and the auxiliary shield 17 outside the circular portion where the first and second screening members 14 and 15 screen the overall substrate 18 in cooperation with each other. That is, the rotating mechanism 30 which can be a particle source is spaced apart from the substrate 18. This can suppress the generation of particles near the substrate.

The rotating mechanism to rotate the first and second screening members 14 and 15 about a single axis will now be described with reference to FIGS. 3A to 3E. FIG. 3A is a plan view of the rotating mechanism 30. FIG. 3B is a side view of the rotating mechanism 30. As shown in FIG. 3B, a spring 25 is provided between a base 24 of the second screening member and a base 23 to provide the base 24 of the second screening member with repulsive force with respect to the base 23. The base 23 is fixed to the chamber 8, and hence is not rotated by the repulsive force. On the other hand, since the base 24 of the second screening member is rotatable, the repulsive force applied to the spring 25 produces force always acting on the second screening member 15 to rotate it counterclockwise (first rotating direction) about a shaft 27. The shaft 27 functions as a rotation axis about which the rotating mechanism 30 rotates the first and second screening members 14 and 15. FIG. 3C is a sectional view taken along a line A of the rotating mechanism 30 in FIG. 3B. FIG. 3D is a sectional view taken along a line B of the rotating mechanism 30 in FIG. 3B. FIG. 3E is a sectional view taken along a line C of the rotating mechanism 30 in FIG. 3C.

The rotating operation of the first and second screening members 14 and 15 will now be described with reference to FIGS. 4A, 4B, 5A and 5B. FIG. 4A is a plan view for explaining the operation to be performed when the first and second screening members 14 and 15 move from the screening position to the retreat position. FIG. 4B is a plan view for explaining the operation to be performed when the first and second screening members 14 and 15 move from the retreat position to the screening position. FIG. 5A is a plan view for explaining the operation of the rotating mechanism 30 when the first and second screening members 14 and 15 move from the screening position to the retreat position. FIG. 5B is a plan view for explaining the operation of the rotating mechanism 30 when the first and second screening members 14 and 15 move from the retreat position to the screening position.

The operation to be performed when the first and second screening members 14 and 15 move from the screening position to the retreat position will now be described with reference to FIGS. 4A and 5A. Refer to FIG. 4A first. In FIG. 4A, (4a-1) shows the screening state in which the first and second screening members 14 and 15 screen an area above the substrate 18. In this state, the first screening member 14 in the form of a semicircular disk screens the right half area (first screening area) above the substrate 18, and the second screening member 15 in the form of a semicircular disk screens the left half area (second screening area) above the substrate 18. The first and second screening members 14 and 15 partly overlap each other at their diameter portions. In FIG. 4A, (4a-2) shows a state in which the rotating mechanism 30 rotates the first and second screening members 14 and 15 about the shaft 27 in the first rotating direction (counterclockwise in this case) through the same angle. When the second screening member 15 rotates through a predetermined second angle (26° in this case), a stopper 29 regulates further rotation of the second screening member 15 and stops it. On the other hand, as shown in (4a-3) in FIG. 4A, the first screening member 14 keeps rotating up to a predetermined first angle (45° in this case) and stops at the position where it overlaps the second screening member 15 which has stopped in advance.

The operation of the rotating mechanism 30 for the first and second screening members 14 and 15 will be described next with reference to FIG. 5A. In FIG. 5A, (5a-1) shows how the rotating mechanism 30 operates when the first and second screening members 14 and 15 are located at the position in (4a-1) in FIG. 4A. As shown in FIG. 3B, the first screening member 14 is directly coupled to the driving mechanism 11 which rotates/drives the first screening member through the shaft 27. In the screening state, the driving mechanism 11 is at a stop, and hence the first screening member 14 is also at a stop. As shown in FIG. 3B, the second screening member 15 is fixed on the base 24 of the second screening member. Since the 24 of the second screening member is connected to the shaft 27 through a bearing 26, the rotational force of the driving mechanism 11 is not transferred to the base 24 of the second screening member. That is, the base 24 of the second screening member can rotate without the operation of the driving mechanism 11. As shown in FIG. 3B, the spring 25 is provided between the base 24 of the second screening member and the base 23, and the base 23 is fixed to the chamber 8.

Therefore, the repulsive force of the spring 25 produces force always acting on the second screening member 15 to rotate it about the shaft 27 counterclockwise. As shown in FIGS. 3A to 3C, a pin 22 fixed to the first screening member 14 is inserted in a hole 31 formed in the upper surface of the base 24 of the second screening member. The pin 22 is configured to rotate about the shaft 27 through an angle corresponding to the difference between the first and second angles (45°−26°=19° in this case) inside the hole 31 in a stopped state. At the screening position, since the pin 22 is in contact with one end of the hole 31, the second screening member 15 cannot rotate counterclockwise. As a consequence, the second screening member 15 stops. Note that since a first stopper 19 regulates the clockwise rotation of the second screening member 15 at the screening position, the screening position is held even if clockwise force is applied to the second screening member 15.

As shown in (4a-2) in FIG. 4A, when the driving mechanism 11 drives the shaft 27 counterclockwise, the first screening member 14 rotates about the shaft 27 counterclockwise in accordance with the driving of the driving mechanism 11. When the first screening member 14 rotates counterclockwise, the pin 22 which has stopped the rotation of the base 24 of the second screening member rotates about the shaft 27, as shown in (5a-2) in FIG. 5A. Since the second screening member 15 is always biased by the spring 25 to rotate counterclockwise, the base 24 of the second screening member, which has the hole 31, also rotate in accordance with the rotation of the pin 22. That is, the second screening member 15 also rotates counterclockwise in accordance with the driving of the driving mechanism 11. A spring 20 mounted on the upper surface of the base 24 of the second screening member comes into contact with a stopper 21 of the spring. The spring 20 applies clockwise force to the second screening member 15. The relationship between the spring force of the spring 20 and that of the spring 25 is set such that the spring 25 has larger force than the spring 20. For this reason, the second screening member 15 decelerates while rotating counterclockwise.

As shown in (5a-2) in FIG. 5A, the base 24 of the second screening member comes into contact with a second stopper 29 when rotating through the second angle "26°" while decelerating, and hence the second screening member 15 stops its rotation at the position of the second stopper 29. This reduces the shock when the base 24 of the second screening member comes into contact with the second stopper 29. As shown in (5a-3) in FIG. 5A, since the hole 31 has a shape conforming to the locus of rotation of the pin 22 around the shaft 27, the first screening member 14 can rotate counterclockwise until the pin 22 reaches the other end of the hole 31. That is, after the second screening member 15 stops at the second angle "26°", the first screening member 14 keeps rotating beyond the second angle "26°"

When the driving mechanism 11 stops driving at the set stop position (first angle "45°"), the first screening member 14 stops at the retreat position corresponding to the first angle "45°", as shown in (5a-3) in FIG. 5A. At this time, since the second screening member 15 has already stopped, when the first screening member 14 stops, the retreat operation is complete. At the retreat position where the base 24 of the second screening member is in contact with the second stopper 29 and the first screening member 14 is at the second angle "45°", the pin 22 fixed to the first screening member 14 has reached the other end of the hole 31 of the base 24 of the second screening member. When the pin 22 reaches the other end of the hole 31, the clockwise rotation of the second screening member 15 is regulated. Even if, therefore, clockwise force is applied to the second screening member 15, the member is held at the retreat position.

Screening operations in which the first and second screening members 14 and 15 move from the retreat position to the screening position will now be described with reference to FIGS. 4B and 5B. Refer to FIG. 4B first. In FIG. 4B, (4b-1) shows a state in which the first and second screening members 14 and 15 overlap each other and are at a stop at the retreat position where the area above the substrate 18 is open. At the retreat position, the second screening member 15 reaches the second angle "26°", and the first screening member 14 is at the first angle "45°". In FIG. 4B, (4b-2) shows a state in which the rotating mechanism 30 rotates the first screening member 14 clockwise to the position of the second angle "26°" while the second screening member 15 is at a stop at the position of the second angle "26°". When the first screening member 14 rotates clockwise beyond the position of the second angle "26°", the rotating mechanism 30 starts rotating the second screening member 15. As shown in (4b-3) in FIG. 4B, the first and second screening members 14 and 15 then stop at the screening position to screen the area above the substrate 18.

The operation of the rotating mechanism 30 in the screening operation of the first and second screening members 14 and 15 shown in FIG. 4B will be described next with reference to FIG. 5B. In FIG. 5B, (5b-1) shows how the rotating mechanism 30 operates when the first and second screening members 14 and 15 are at the retreat position shown in (4b-1) in FIG. 4B. As shown in FIG. 3B, the first screening member 14 is directly coupled to the driving mechanism 11 through the shaft 27. In the retreat state, since the driving mechanism 11 stops its driving, the first screening member 14 is also held in a stopped state. On the other hand, counterclockwise rotational force always acts on the second screening member 15, as described above. At the retreat position, however, the base 24 of the second screening member comes into contact with the second stopper 29 to be inhibited from rotating counterclockwise so as to be held in the retreat state.

As shown in (4b-2) in FIG. 4B, when the driving mechanism 11 drives the shaft 27 clockwise, the first screening member 14 rotates clockwise in accordance with the rotation of the driving mechanism 11. When the first screening member 14 rotates, the pin 22 directly coupled to the first screening member 14 rotates along the hole 31 from one end of the hole 31 of the second screening member 15 to the other end, as shown in (5b-2) in FIG. 5B. During this period, as shown in (4b-2) in FIG. 4B, the second screening member 15 maintains its stopped state. Force always acts on the second screening member 15 to rotate it counterclockwise, and the pin 22 fixed to the first screening member 14 does not come into contact with the hole 31 of the base 24 of the second screening member until the first screening member 14 reaches the position of the second angle "26°". For this reason, the second screening member 15 keeps staying at the retreat position without rotating until the first screening member 14 reaches the position of the second angle "26°".

When the pin 22 coupled to the first screening member 14 moves along the hole 31 of the second screening member 15 and reaches the other end of the hole 31, the pin 22 can transfer its rotational force to the base 24 of the second screening member. As a result, the second screening member 15 also rotates clockwise accompanying the clockwise rotation of the first screening member 14. That is, when the first screening member 14 rotates clockwise from the position of the second angle "26°", the second screening member 15 simultaneously rotates clockwise.

At the instant when the pin 22 fixed to the first screening member 14 engages with the base 24 of the second screening member, the clockwise rotational force of the first screening member 14 is transferred to the base 24 of the second screening member, and the second screening member 15 is repelled. However, the spring 25 which gives counterclockwise elastic force reduces the shock on the second screening member 15.

The first and second screening members 14 and 15 keep rotating together clockwise from the position of the second angle "26°", and stop at the screening position of an opening of 0° when the driving mechanism 11 stops, as shown in (5b-3) in FIG. 5B. As described above, although counterclockwise force always acts on the second screening member 15, since the pin 22 fixed to the first screening member 14 suppresses the rotation of the base 24 of the second screening member, the second screening member 15 also stops at the same time when the first screening member 14 stops. The base 24 of the second screening member comes into contact with the first stopper 19 at an opening of 0°. With this arrangement, although no clockwise force is generated, the second screening member 15 cannot structurally rotate clockwise and is fixed. Note that in this embodiment, the pin 22 is formed on the first screening member 14, and the hole 31 is formed in the second screening member 15. However, the pin 22 may be formed on the second screening member 15 side, and the hole 31 may be formed on the first screening member 14 side. In addition, in this embodiment, the spring 25 to apply force to the second screening member 15 to rotate it counterclockwise is provided between the base 24 of the second screening member and the base 23. However, the spring 25 may be provided between the base 24 of the second screening member and the first screening member 14 as long as the spring can apply force to the second screening member 15 to rotate it counterclockwise.

Operation at Time of Conditioning Processing

The operation of the sputtering apparatus 100 at the time of conditioning processing will be described next with reference to FIGS. 1 and 2. Note that conditioning processing is the processing of generating electric discharge to stabilize the deposition characteristics, while the first and second screening members 14 and 15 are closed so as not to influence deposition on a substrate, and attracting sputtered particles to the inner wall of the chamber 8 or the like.

First of all, the main control unit instructs the driving mechanism 11 for the first screening member to close the first and second screening members 14 and 15. The main control unit then instructs the driving mechanism 1 for the target holder screening member to close the target holder screening member 3. In accordance with the instruction from the main control unit, the target holder screening member 3 and the first and second screening members 14 and 15 are closed.

The main control unit then instructs the driving unit 10 for the substrate holder to execute ascending operation. This causes the cover shield 6 around the substrate on the substrate holder 9 to move upward to a position where a labyrinth is formed between the cover shield 6 and the shield 4 provided in the chamber 8, as shown in FIG. 1.

The main control unit then instructs the controller to control the inert gas introduction system to introduce an inert gas (e.g., Ar, Ne, Kr, or Xe) from the inert gas introduction system near the target 28 while the target holder screening meer 3 is closed. In this case, introducing an inert gas into near the target 28 will increase the pressure near the target 28 as compared with the pressure near the substrate 18. This forms a state in which electric discharge easily occurs. In this state, the main control unit causes the target power supply to apply power to the target 28 to start electric discharge.

Subsequently, the main control unit issues an instruction to drive the driving mechanism 1 for the target holder screening member so as to open the target holder screening member 3. This starts conditioning processing for the inner wall of the chamber 8. Sputtered particles emitted from the target 28 are attracted to the inner wall of the chamber 8 to deposit films. If the shields 4 and 5 are provided on the inner wall, sputtered particles from the target 28 are attracted to the desired surfaces of the shields 4 and 5 to deposit films. Note however that since the first and second screening members 14 and 15 cover the substrate holder 9 at the screening position shown in 2A in FIG. 2, it is possible to prevent sputtered particles from detouring to the substrate mount surface of the substrate holder 9. In this state, so-called conditioning processing is performed to form a film on the inner wall of the chamber 8 or a constituent member such as a shield. Performing conditioning processing in this manner makes it possible to stabilize the reaction between sputtered particles and a reactive gas while the screening members 14 and 15 are open. Note that when conditioning processing is to be performed by reactive sputtering discharge, a reactive gas (oxygen, nitrogen, or the like) is introduced from the reactive gas introduction system to near the substrate.

After performing electric discharge for a predetermined period of time, the main control unit stops the discharge by stopping applying power to the target power supply. At this time, films are deposited on surfaces of the shields 4 and 5, target holder screening member 3, substrate screening members 14 and 15, and the like which face the target.

The main control unit then issues an instruction to stop the supply of an inert gas to a controller which controls the inert gas introduction system. The main control unit instructs the reactive gas introduction system to also stop the supply of a reactive gas when the reactive gas is supplied. Thereafter, the main control unit instructs the driving mechanism 1 to close the target holder screening member 3 (the screening plates having the double rotation structure).

The main control unit instructs the driving unit 10 for the substrate holder to lower the substrate holder 9, thus completing the conditioning processing.

The above procedure can perform conditioning processing while preventing sputtered particles from being attracted to the substrate mount surface of the substrate holder 9. Note that it is possible to execute target cleaning operation of removing impurities and oxides adhering to the target 28 before deposition by a procedure similar to that for the above conditioning processing.

Pre-Sputtering Operation and Deposition on Substrate

The following is a description of the operation of the sputtering apparatus 100 in a case in which pre-sputtering operation and deposition on a substrate are performed. Deposition on each substrate is performed after pre-sputtering. Pre-sputtering in this case is sputtering to be performed to stabilize electric discharge while the screening members 14 and 15 are closed to prevent the discharge from influencing deposition on each substrate.

First of all, the main control unit instructs the driving mechanism 11 for the first screening member to close the first and second screening members 14 and 15 (the screening position indicated by 2A in FIG. 2). The main control unit then instructs the driving mechanism 1 for the target holder screening member to close the target holder screening member. This sets the target holder screening member 3 and the first and second screening members 14 and 15 in the closed state. In this state, the substrate holder 9 is located at the standby position (FIG. 1).

The main control unit then issues an instruction to open the gate valve 7 of the chamber wall and load the substrate 18 into the chamber through the gate valve 7 by using a substrate convey unit (not shown) outside the chamber. The substrate 18 is loaded into the chamber through between the first and second screening members 14 and 15 and the cover shield 6 around the substrate, and is placed on the substrate mount surface of the substrate holder 9 by cooperation between the substrate convey unit outside the chamber and a lift mechanism (not shown) inside the substrate holder.

Subsequently, the main control unit rotates the substrate holder 9 by driving the driving unit 10 for the substrate holder. The main control unit introduces an inert gas (Ar, Ne, Kr, or Xe) through the inert gas introduction system provided near the target. The main control unit starts electric discharge by applying power from the target power supply to the target. Starting sputtering in this manner while the first and second screening members 14 and 15 are closed can prevent sputtered particles from being attracted to the substrate.

After an electric discharge stabilization time of a predetermined period (3 to 15 sec) during which electric discharge is stabilized, the main control unit opens the target holder screening member 3 and starts pre-sputtering. Note that when abnormality, for example, failure to start electric discharge, occurs, the main control unit can detect it by monitoring a discharge voltage/current and stop the deposition sequence. If there is no problem, since the target holder screening member 3 is opened, sputtered particles are attracted to the inner wall of the chamber to deposit films, as described above. When deposition is to be performed by reactive sputtering, a reactive gas is introduced into the chamber through the reactive gas introduction system near the substrate. Sputtered particles are attracted to the shield surfaces of the shields 4 and 5 on the inner wall to deposit films on the shield surfaces.

After performing pre-sputtering for a necessary period of time, the main control unit causes the driving mechanism 11 for the first screening member to open the first and second screening members 14 and 15, and starts deposition on the substrate 18.

After performing electric discharge for a predetermined period of time, the main control unit stops the electric discharge by stopping applying power, and stops the supply of an inert gas. The main control unit further stops the supply of a reactive gas, when the reactive gas is supplied. The main control unit closes the first and second screening members 14 and 15 and the target holder screening member 3.

The main control unit then opens the gate valve 7 (not shown) of the chamber, and unloads the substrate in a sequence reverse to that in loading operation. The main control unit then completes pre-sputtering and deposition processing for the substrate.

Operating the screening mechanism in the above procedure can prevent sputtered particles from entering the substrate and form high-quality films.

According to the sputtering apparatus of this embodiment, it is possible to provide a sputtering apparatus which prevents sputtered particles from being attracted to the substrate mount surface of the substrate holder when performing electric discharge aimed at conditioning processing, pre-sputtering, and target cleaning. It is possible to manufacture an electronic device in the above procedure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-291336 filed Dec. 22, 2009, Japanese Patent Application No. 2010-127300 filed Jun. 2, 2010, which are hereby incorporated by reference herein in their entirety.

What is claimed is:

1. A sputtering apparatus comprising a substrate holder configured to hold a substrate, a target holder configured to hold a target, and a screening member configured to screen a substrate mount region of a surface of the substrate holder on which a substrate is mounted, wherein the substrate mount region includes a first area and a second area, wherein the first area and the second area do not overlap, wherein the screening member comprises a first screening member configured to rotate about an axis in a first direction perpendicular to a surface parallel to the substrate mount region and screen at least the first area, a second screening member configured to rotate about the axis and screen at least the second area, and a rotating mechanism configured to rotate the first screening member and the second screening member, wherein the axis is located away from the substrate mount region in a direction of the surface parallel to the substrate mount region, wherein the first screening member and the second screening member are configured to be rotated by the rotating mechanism to move between a screening position at which the first screening member screens at least the first area and the second screening member screens at least the second area and a retreat position at which the first screening member and the second screening member retract from above the substrate mount region and overlap each other, wherein the first screening member is moved from the screening position to the retreat position by being rotated by the rotating mechanism about the axis through a first angle in one rotating direction, and the second screening member is moved from the screening position to the retreat position by being rotated by the rotating mechanism about the axis through a second angle smaller than the first angle in the one rotating direction, wherein the rotating mechanism includes a driving mechanism configured to rotate and drive the first screening member between the screening position and the retreat position, a regulating member configured to regulate rotation of the second screening member about the axis within a range of the second angle between the screening position and the retreat position, a member configured to apply force to the second screening member to rotate the second screening member about the axis in the first rotating direction, a first engaging member formed on the first screening member, and a second engaging member formed on the second screening member, and one of the first engaging member and the second engaging member includes a pin, and the other of the first engaging member and the second engaging member includes a hole, the pin being configured to rotate about the axis in the hole in a stopped state through an angle corresponding to a difference between the first angle and the second angle, or the hole being configured to rotate about the axis relative to the pin located in the hole and set in a stopped state through the angle corresponding to the difference.

2. The apparatus according to claim 1, wherein the regulating member includes a first stopper and a second stopper configured to regulate rotation of the second screening member at each of the screening position and the retreat position, and the member configured to apply force to the second screening member includes a spring.

3. The apparatus according to claim 1, further comprising a shield, inside a chamber, configured to surround the outer periphery of the substrate holder, wherein the axis is provided outside the shield.

4. A sputtering apparatus comprising:
a substrate holder configured to hold a substrate;
a target holder configured to hold a target;
a screening member configured to screen a substrate mount region of a surface of the substrate holder on which a substrate is mounted; and
a shield, inside a chamber, configured to surround the outer periphery of the substrate holder,
wherein the substrate mount region includes a first area and a second area,
wherein the first area and the second area do not overlap,
wherein the screening member comprises a first screening member configured to rotate about an axis in a first direction perpendicular to a surface parallel to the substrate mount region and screen at least the first area, a second screening member configured to rotate about the axis and screen at least the second area, and a rotating mechanism configured to rotate the first screening member and the second screening member,
wherein the axis is located away from the substrate mount region in a direction of the surface parallel to the substrate mount region,
wherein the first screening member and the second screening member are configured to be rotated by the rotating mechanism to move between a screening position at which the first screening member screens at least the first area and the second screening member screens at least the second area and a retreat position at which the first screening member and the second screening member retract from above the substrate mount region and overlap each other,
wherein the axis is provided outside the shield, and
wherein, in the retreat position, the first screening member and the second screening member overlap each other inside the shield.

* * * * *